United States Patent
Mao

(10) Patent No.: US 11,439,033 B2
(45) Date of Patent: Sep. 6, 2022

(54) ELECTRONIC DEVICE AND TRAY STRUCTURE THEREOF

(71) Applicant: Wistron Corp., New Taipei (TW)

(72) Inventor: Zhong-Hui Mao, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/900,796

(22) Filed: Jun. 12, 2020

(65) Prior Publication Data
US 2021/0227715 A1 Jul. 22, 2021

(30) Foreign Application Priority Data
Jan. 16, 2020 (CN) .......................... 202020098873.1

(51) Int. Cl.
*H05K 7/14* (2006.01)
*G06F 1/18* (2006.01)
*H05K 5/02* (2006.01)

(52) U.S. Cl.
CPC ........... *H05K 7/1489* (2013.01); *G06F 1/183* (2013.01); *H05K 5/0221* (2013.01); *H05K 7/1457* (2013.01); *H05K 7/1492* (2013.01)

(58) Field of Classification Search
None
See application file for complete search history.

(56) References Cited

U.S. PATENT DOCUMENTS

| | | | | |
|---|---|---|---|---|
| 5,481,431 A | * | 1/1996 | Siahpolo | G06F 1/184 361/679.31 |
| 5,641,296 A | * | 6/1997 | Larabell | G06F 1/184 439/157 |
| 5,721,669 A | * | 2/1998 | Becker | G11B 33/124 361/679.31 |
| 6,616,106 B1 | * | 9/2003 | Dean | G06F 1/184 248/27.1 |
| 7,257,827 B2 | * | 8/2007 | Lee | G11B 33/022 312/223.2 |
| 7,771,218 B2 | * | 8/2010 | Jaramillo | H05K 7/1492 439/157 |
| 9,122,458 B2 | * | 9/2015 | Yu | G06F 1/185 |
| 9,229,496 B2 | * | 1/2016 | Cravens | H05K 7/1487 |
| 9,230,606 B2 | * | 1/2016 | Ding | G11B 33/02 |

(Continued)

FOREIGN PATENT DOCUMENTS

CN 103970216 A 8/2014
CN 205389303 U 7/2016
(Continued)

*Primary Examiner* — Xanthia C Cunningham

(57) ABSTRACT

An electronic device is provided. The electronic device includes a housing, a first riser module, a hard-disk backplane module, and a plurality of hard-disks. The first riser module is disposed in the housing. The first riser module includes a first tray structure and a first riser board. The first riser board is disposed on the first tray structure. The first tray structure is adapted to move the first riser board in a first direction. The hard-disk backplane module is disposed in the housing. The tray structure is adapted to move the first riser board in the first direction to connect the hard-disk backplane module. The hard-disks are connected to the hard-disk backplane module. The modules of the electronic device of the embodiment of the invention can be coupled together more easily.

22 Claims, 18 Drawing Sheets

(56) References Cited

U.S. PATENT DOCUMENTS

| | | | | |
|---|---|---|---|---|
| 9,456,519 B2* | 9/2016 | Bailey | .................. | G11B 33/128 |
| 9,462,719 B2* | 10/2016 | Wu | ...................... | H05K 7/1417 |
| 9,674,978 B2* | 6/2017 | Wu | ........................ | G06F 1/185 |
| 9,717,158 B2* | 7/2017 | Della Fiora | .......... | H05K 7/1487 |
| 9,826,658 B1* | 11/2017 | Mao | ...................... | H05K 7/1487 |
| 9,936,599 B1* | 4/2018 | Shih | ........................ | G06F 1/183 |
| 10,168,747 B2* | 1/2019 | Zhu | ...................... | H05K 7/1489 |
| 10,212,840 B2* | 2/2019 | Kuan | ...................... | H05K 7/1487 |
| 10,251,300 B1* | 4/2019 | Mao | ...................... | H05K 7/1487 |
| 10,564,685 B2* | 2/2020 | Chen | ...................... | G06F 1/186 |
| 2006/0171110 A1* | 8/2006 | Li | ........................... | G06F 1/184 |
| | | | | 361/679.37 |
| 2009/0225527 A1* | 9/2009 | Olesiewicz | ........ | H05K 7/20727 |
| | | | | 361/802 |
| 2013/0070422 A1* | 3/2013 | Dunham | ................. | G06F 1/187 |
| | | | | 361/725 |
| 2015/0070858 A1* | 3/2015 | Wu | ...................... | H05K 7/1409 |
| | | | | 361/754 |
| 2015/0085451 A1* | 3/2015 | Yu | ........................... | G06F 1/185 |
| | | | | 361/747 |
| 2015/0103492 A1* | 4/2015 | Wu | ...................... | H05K 7/1431 |
| | | | | 361/726 |
| 2017/0045921 A1* | 2/2017 | Norton | .................... | G06F 1/181 |
| 2017/0196107 A1* | 7/2017 | Chen | ........................ | H05K 7/16 |

FOREIGN PATENT DOCUMENTS

| | | |
|---|---|---|
| CN | 208752516 U | 4/2019 |
| CN | 110018721 A | 7/2019 |
| CN | 210776520 U | 6/2020 |
| TW | 201039094 A1 | 11/2010 |
| TW | 201328510 A1 | 7/2013 |

* cited by examiner

ELECTRONIC DEVICE AND TRAY STRUCTURE THEREOF

CROSS REFERENCE TO RELATED APPLICATIONS

This Application claims priority of China Patent Application No. 202020098873.1, filed on Jan. 16, 2020, the entirety of which is incorporated by reference herein.

BACKGROUND OF THE INVENTION

Field of the Invention

The present invention relates to an electronic device, and in particular to an electronic device which can be easily assembled and disassembled.

Description of the Related Art

Conventional servers include hard-disks, hard-disk backplanes, riser boards, power supplies, and mainboards. In the limited amount of space inside such a server, the elements are coupled to each other via cables. Therefore, the process of assembling a conventional server is complicated, and the maintenance process for the conventional server is difficult. Additionally, the cables interrupt the air flow inside the server, which can negatively affect the heat dissipation of the server.

BRIEF SUMMARY OF THE INVENTION

Embodiments of the invention are provided to address the aforementioned difficulty.

In one embodiment, a tray structure is provided, which is adapted to be connected to a housing. The tray structure includes a tray body, a slider and a grip. The tray body includes a tray body post. The slider includes a slider post. The grip pivots on the tray body and the slider. When the grip is in the first grip orientation, the tray body post is in a first tray post position relative to the slider post. When the grip is in the second grip orientation, the tray body post is in a second tray post position relative to the slider post.

In another embodiment, an electronic device is provided. The electronic device includes a housing and a tray structure. The housing includes a housing groove. The housing groove comprises a first section and a second section, and the first section is perpendicular to the second section. The tray structure includes a tray body, a slider and a grip. The tray body includes a tray body post. The slider includes a slider post. The grip pivots on the tray body and the slider. When the grip is in the first grip orientation, the tray body post is in a first tray post position relative to the slider post. When the grip is in the second grip orientation, the tray body post is in a second tray post position relative to the slider post. When the grip is in the first grip orientation, the tray body post and the slider post are adapted to be inserted into the first section simultaneously. When the grip is rotated from the first grip orientation to the second grip orientation, the tray body post is slid along the second section into the second tray post position.

In further another embodiment, an electronic device is provided. The electronic device includes a housing, a first riser module, a hard-disk backplane module and a plurality of hard-disks. The first riser module is disposed in the housing. The first riser module comprises a first tray structure and a first riser board, the first riser board is disposed on the first tray structure, and the first tray structure is adapted to move the first riser board in a first direction. The hard-disk backplane module is disposed in the housing. The tray structure is adapted to move the first riser board in the first direction to connect the hard-disk backplane module. The hard-disks are connected to the hard-disk backplane module.

Utilizing the electronic device of the embodiment of the invention, the riser module, the hard-disk backplane module, the power connection board module and the mainboard module are plugged directly into each other. There is no need for conventional cables. The electronic device of the embodiment of the invention can be easily assembled and disassembled. The electronic device of the embodiment of the invention also provides improved reliability and heat dissipation.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
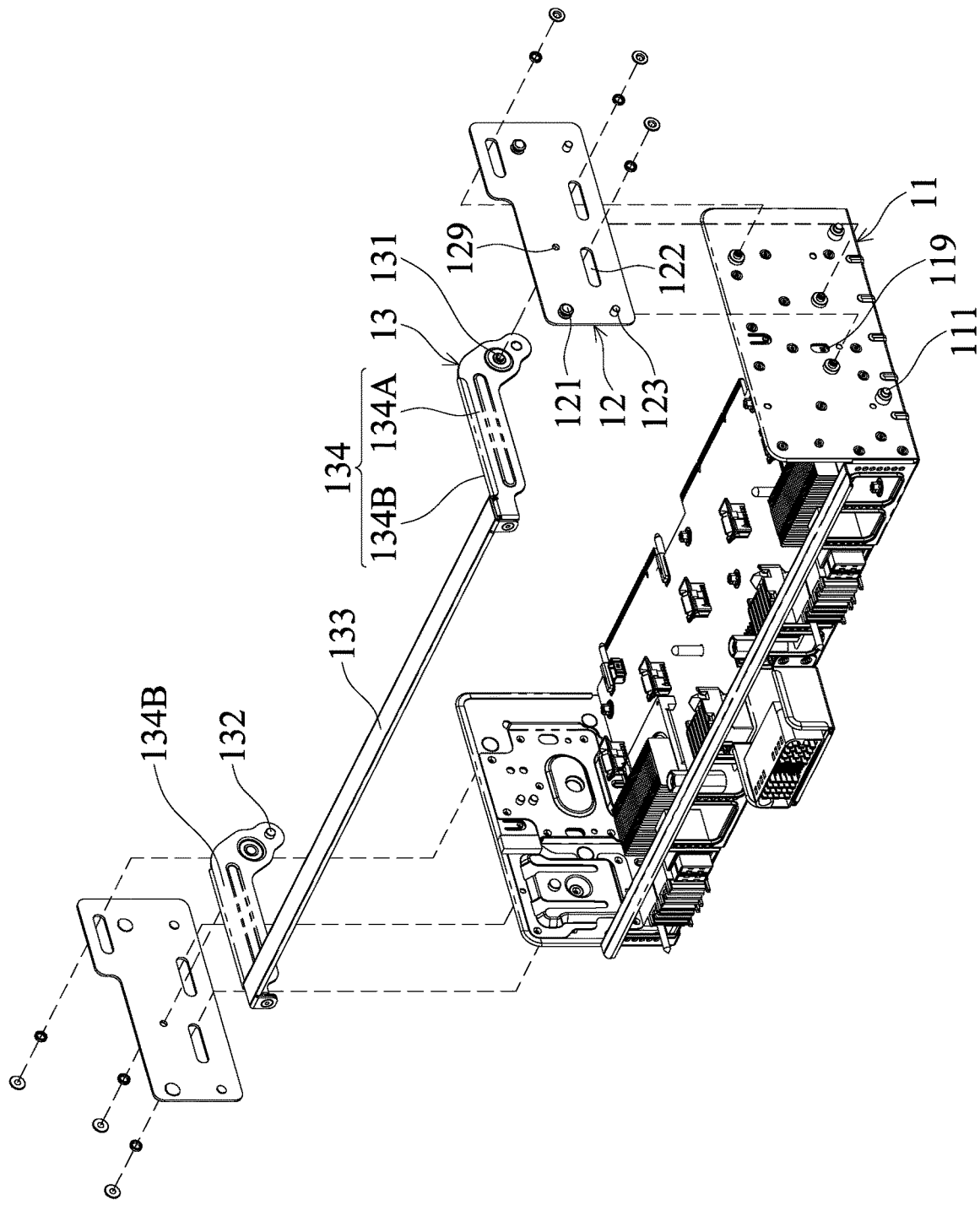
FIG. 1 is an exploded view of a tray structure of the embodiment of the invention.
Figure 2:
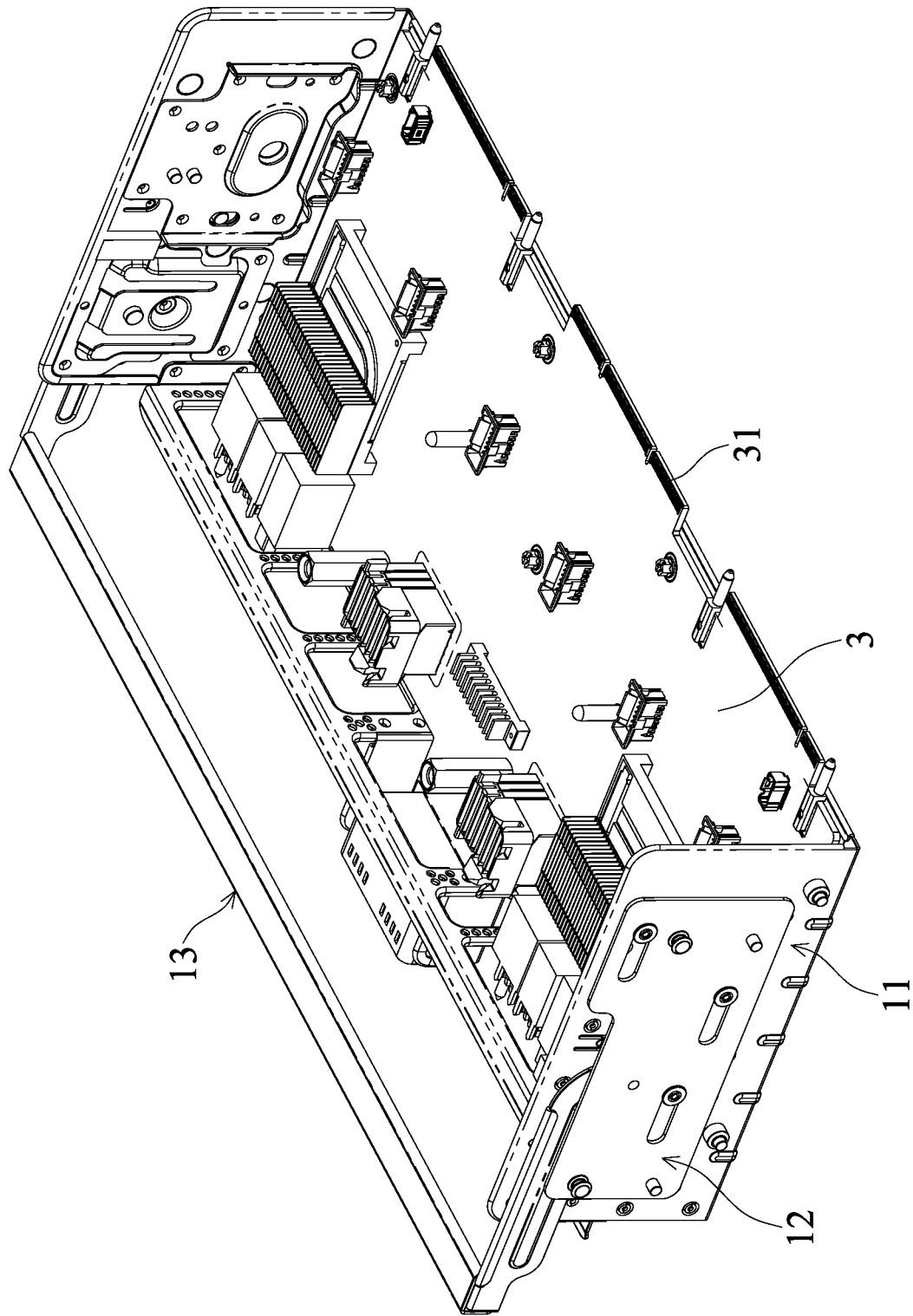
FIG. 2 is an assembled view of the tray structure of the embodiment of the invention.

FIG. 1 is an exploded view of a tray structure of the embodiment of the invention. FIG. 2 is an assembled view of the tray structure of the embodiment of the invention. With reference to FIGS. 1 and 2, one embodiment of the invention provides a tray structure 1 which is adapted to be connected to a housing. The tray structure 1 includes a tray body 11, a slider 12 and a grip 13. The tray body 11 includes a tray body post 111. The slider 12 includes a slider post 121. The grip 13 pivots on the tray body 11 and the slider 12.

Figure 3A:
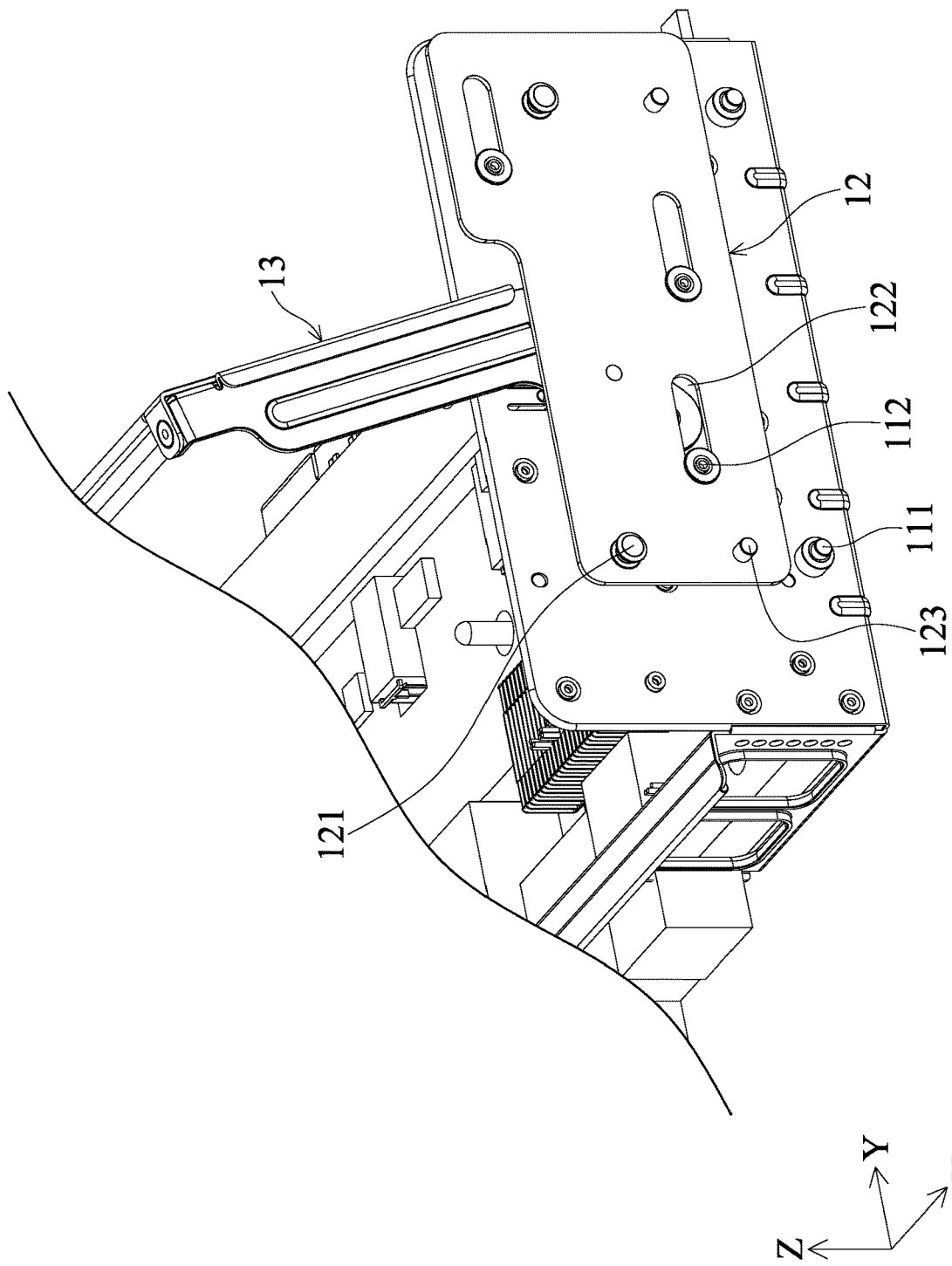
FIG. 3A shows the tray structure of the embodiment of the invention, wherein the grip is in the first grip orientation.
Figure 3B:
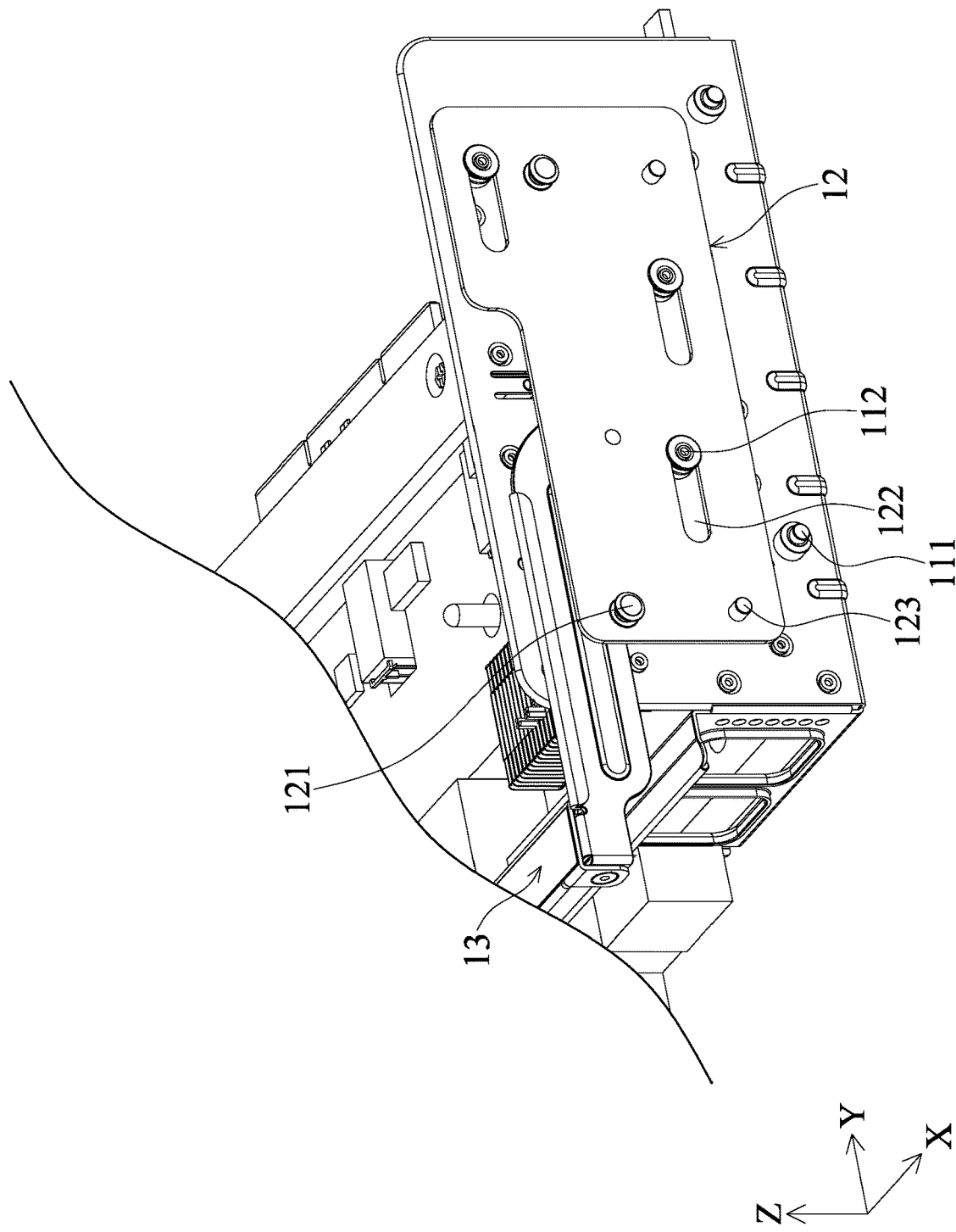
FIG. 3B shows the tray structure of the embodiment of the invention, wherein the grip is in the second grip orientation.

FIG. 3A shows the tray structure of the embodiment of the invention, wherein the grip is in the first grip orientation. FIG. 3B shows the tray structure of the embodiment of the invention, wherein the grip is in the second grip orientation. With reference to FIGS. 3A and 3B, when the grip 13 is in the first grip orientation, the tray body post 111 is in a first tray post position (FIG. 3A) relative to the slider post 121. When the grip 13 is in the second grip orientation, the tray body post 111 is in a second tray post position (FIG. 3B) relative to the slider post 121.

Figure 4:
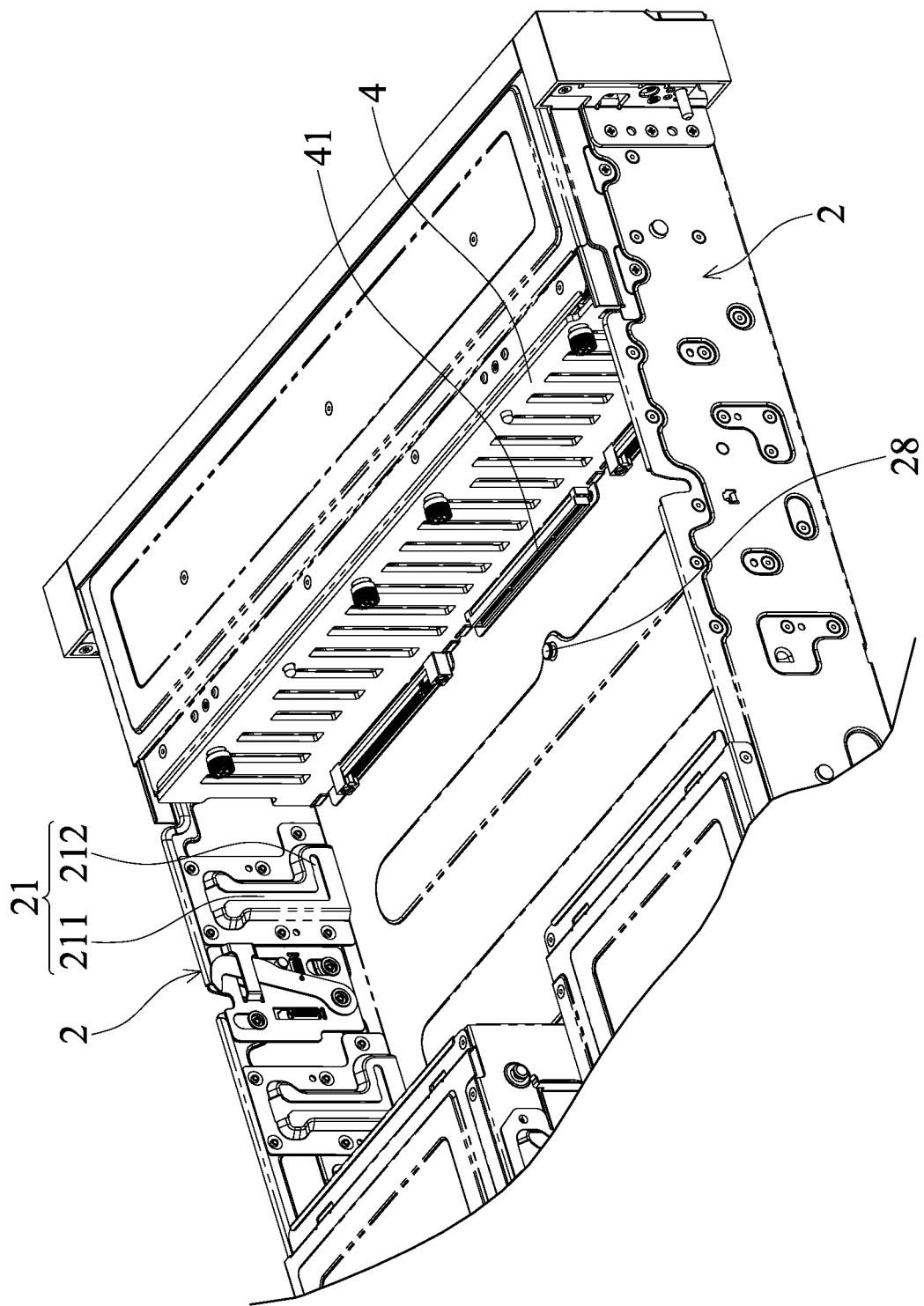
FIG. 4 shows a portion of a housing of the embodiment of the invention.

FIG. 4 shows a portion of the housing of the embodiment of the invention. With reference to FIG. 4, in one embodiment, the housing 2 comprises a housing groove 21. The housing groove 21 comprises a first section 211 and a second section 212. The first section 211 is perpendicular to the second section 212.

Figure 5A:
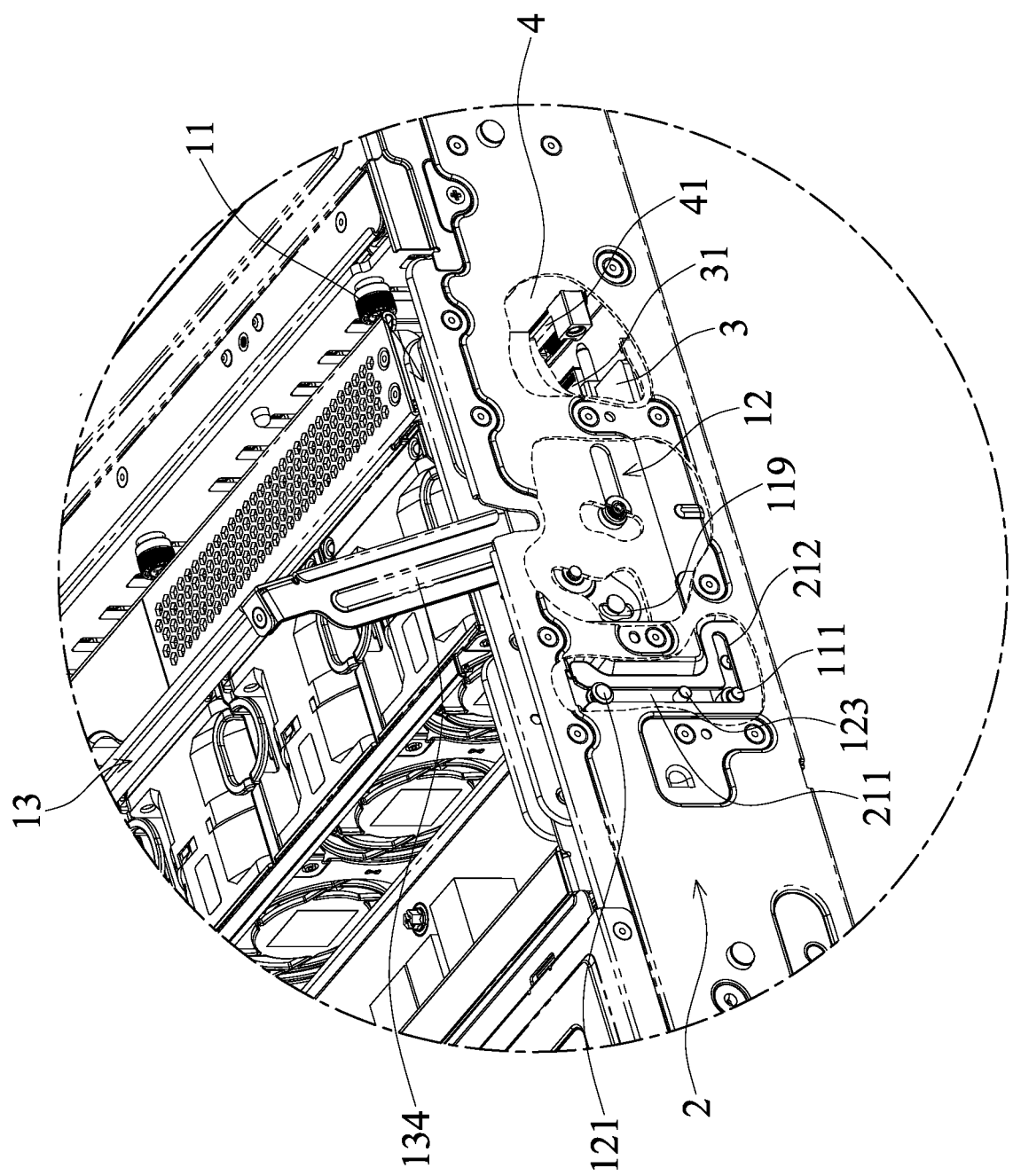
FIG. 5A shows the tray structure of the embodiment of the invention combined with the housing, wherein the grip is in the first grip orientation.
Figure 5B:
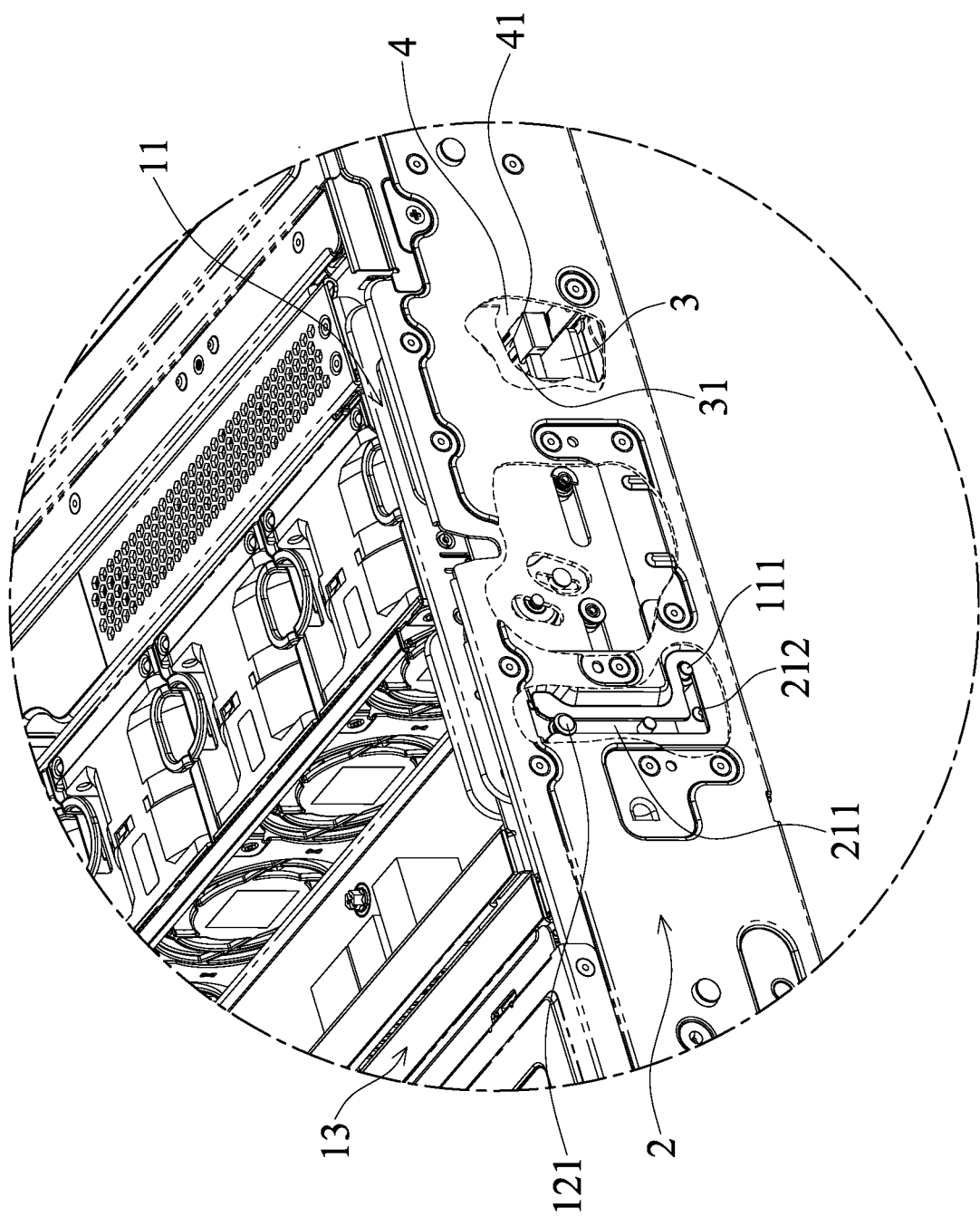
FIG. 5B shows the tray structure of the embodiment of the invention combined with the housing, wherein the grip is in the second grip orientation.

FIG. 5A shows the tray structure of the embodiment of the invention combined with the housing, wherein the grip is in the first grip orientation. FIG. 5B shows the tray structure of the embodiment of the invention combined with the housing, wherein the grip is in the second grip orientation. In FIGS. 5A and 5B, several covered portions are shown with partial section and dotted line. With reference to FIGS. 5A and 5B, when the grip 13 is in the first grip orientation, the tray body post 111 and the slider post 121 of the tray structure 1 are adapted to be inserted into the first section 211 of the housing 2 simultaneously, meanwhile the tray body post 111 is in the first tray post position relative to the slider post 121 (FIG. 5A). When the grip 13 is rotated from the first grip orientation to the second grip orientation, the tray body post 111 is slid along the second section 212 of the housing 2 into the second tray post position (FIG. 5B). In other words, when the grip 13 is in the first grip orientation, the tray body post 111 and the slider post 121 are on the same vertical line. When the grip 13 is in the second grip orientation, the tray body post 111 and the slider post 121 are not on the same vertical line.

With reference to FIG. 1, in one embodiment, the grip 13 comprises a first pivot portion 131 and a second pivot portion 132. The first pivot portion 131 pivots on a pivoting hole 129 of the slider 12. The second pivot portion 132 pivots on a tray body slot 119 of the tray body 11.

With reference to FIGS. 1, 5A and 5B, in one embodiment, the grip 13 comprises a holding section 133 and two connection arms 134. The first pivot portion 131 and the second pivot portion 132 are disposed on the connection arm 134. The slider 12 is sandwiched between the connection arm 134 and the housing 2. The connection arm 134 is sandwiched between the slider 12 and the tray body 11.

With reference to FIG. 1, in one embodiment, the connection arm 134 comprises a first connection arm surface 134A and a second connection arm surface 134B. The first connection arm surface 134A is opposite the second connection arm surface 134B. The first pivot portion 131 protrudes from the first connection arm surface 134A, and the second pivot portion 132 protrudes from the second connection arm surface 134B.

With reference to FIGS. 3A and 3B, in one embodiment, the slider 12 comprises a slider groove 122. The tray body 11 comprises a tray body post 112. The tray body post 112 is inserted into the slider groove 122 and is adapted to slide along the slider groove 122. The slider groove 122 extends in a direction that is parallel to the direction in which the second section 212 of the housing 2 extends. In this embodiment, there are three tray body posts 112 and three slider grooves 122. Utilizing the tray body posts 112 and the slider grooves 122, the slider 12 can stably slide in a horizontal direction relative to the tray body 11.

With reference to FIGS. 1, 5A and 5B, in one embodiment, the tray body 11 further comprises a tray body slot 119. The second pivot portion 132 of the grip 13 slides in the tray body slot 119. The tray body slot 119 extends in a direction that is parallel to the direction in which the first section 211 of the housing 2 extends.

With reference to FIGS. 1, 5A and 5B, in one embodiment, the slider 12 further comprises a slider post 123. The slider post 123 and the slider post 121 are on the same vertical line. The slider post 123 and the slider post 121 of the slider 12 are adapted to be inserted into the first section 211 of the housing 2 simultaneously and abut the inner wall of the first section 211 to stabilize the tray structure 1.

With reference to FIGS. 2 and 4, in the embodiments of the invention, the mentioned housing 2 and the tray structure 1 are parts of an electronic device (for example, a server). In one embodiment, the electronic device further comprises a first riser board 3 and a backplane 4. The first riser board 3 comprises at least one first riser board connection port 31. The backplane 4 comprises at least one backplane connection port 41. The first riser board 3 is disposed on the tray body 11. The backplane 4 is disposed on the housing 2. With reference to FIGS. 5A and 5B, as the tray structure 1 is inserted into the housing 2, when the grip 13 is rotated from the first grip orientation to the second grip orientation, the tray body 11 is moved from a first tray position to a second tray position relative to the housing 2, the tray structure 1 is combined with the housing 2, and the first riser board connection port 31 is connected to the backplane connection port 41. FIG. 5A shows the first riser board connection port 31 not connected to the backplane connection port 41. FIG. 5B shows the first riser board connection port 31 being totally connected to the backplane connection port 41.

Figure 6:
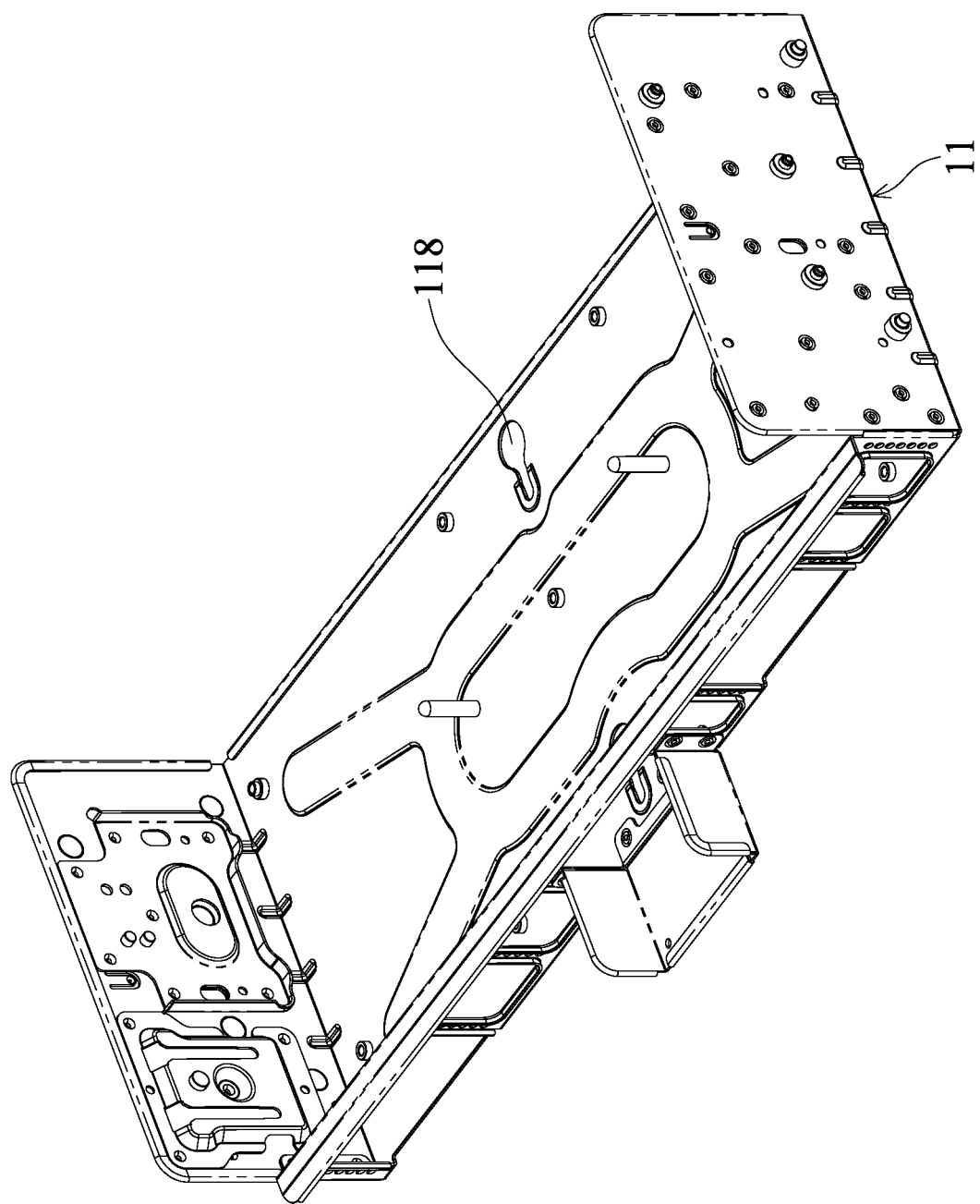
FIG. 6 shows a tray body of the embodiment of the invention.

FIG. 6 shows the tray body of the embodiment of the invention. With reference to FIGS. 4 and 6, in one embodiment, the tray body 11 comprises a tray body groove 118, and the housing 2 comprises a housing post 28. When the tray body 1 is combined with the housing 2 (that means that the tray body post 111 of the tray body 11 and the slider post 121 of the slider 12 are inserted into the first section 211 of the housing 2; first tray post position), the housing post 28 is inserted into the tray body groove 118. When the tray body post 111 of the tray body 11 is slid along the second section 212 of the housing 2 into the second tray post position (that means that the tray body 11 is moved from the first tray position to the second tray position relative to the housing 2), the housing post 28 slides in the tray body groove 118.

Figure 7A:
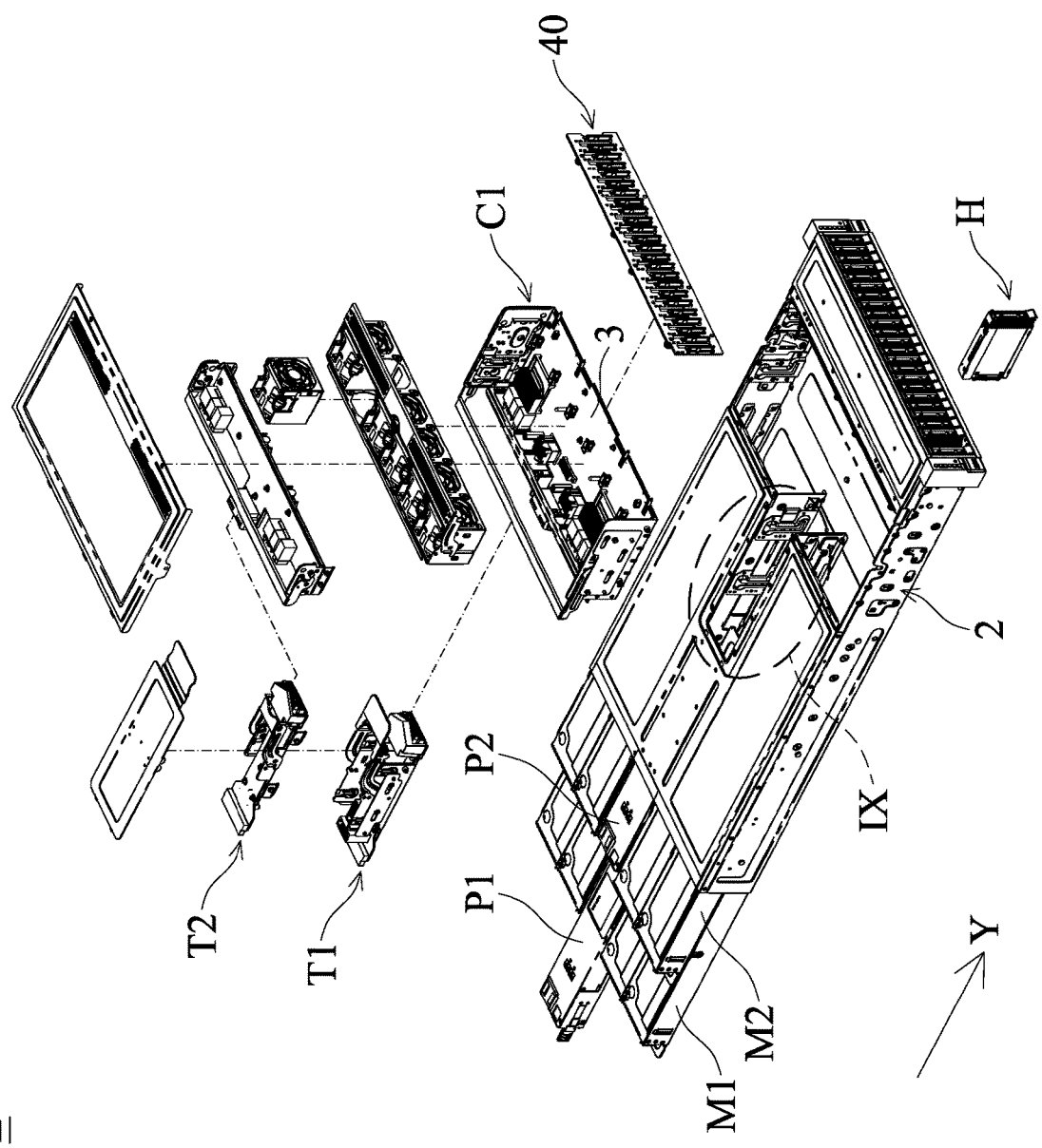
FIG. 7A is an exploded view of an electronic device of the embodiment of the invention.
Figure 7B:
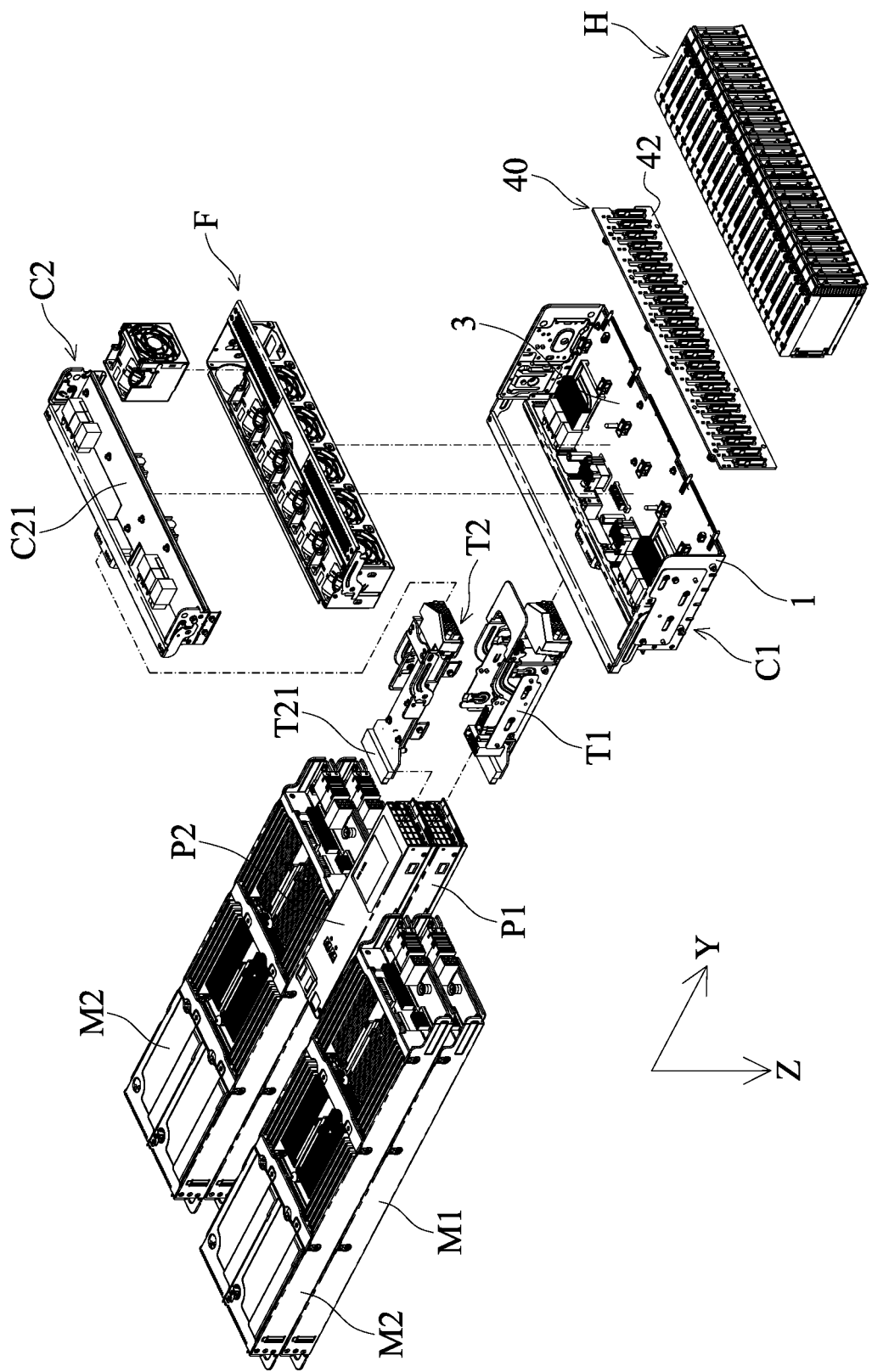
FIG. 7B is an exploded view of the major elements of the electronic device of the embodiment of the invention.

FIG. 7A is an exploded view of the electronic device of the embodiment of the invention. FIG. 7B is an exploded view of the major elements of the electronic device of the embodiment of the invention. With reference to FIGS. 7A and 7B, in one embodiment, the electronic device E includes a housing 2, a first riser module C1, a hard-disk backplane module 40 and a plurality of hard-disks H. The first riser module C1 is disposed in the housing 2. The first riser module C1 comprises a first tray structure 1 (the tray structure 1 mentioned above) and a first riser board 3. The first riser board 3 is disposed on the first tray structure 1. The first tray structure 1 is adapted to move the first riser board 3 in a first direction Y. The hard-disk backplane module 40 is disposed in the housing 2. The tray structure 1 is adapted to move the first riser board 3 in the first direction Y to connect the hard-disk backplane module 40. The hard-disks H are connected to the hard-disk backplane module 40. The hard-disk backplane module 40 comprises a module circuit-board 42, and the module circuit-board 42 is perpendicular to the first riser board 3U.

Figure 8A:
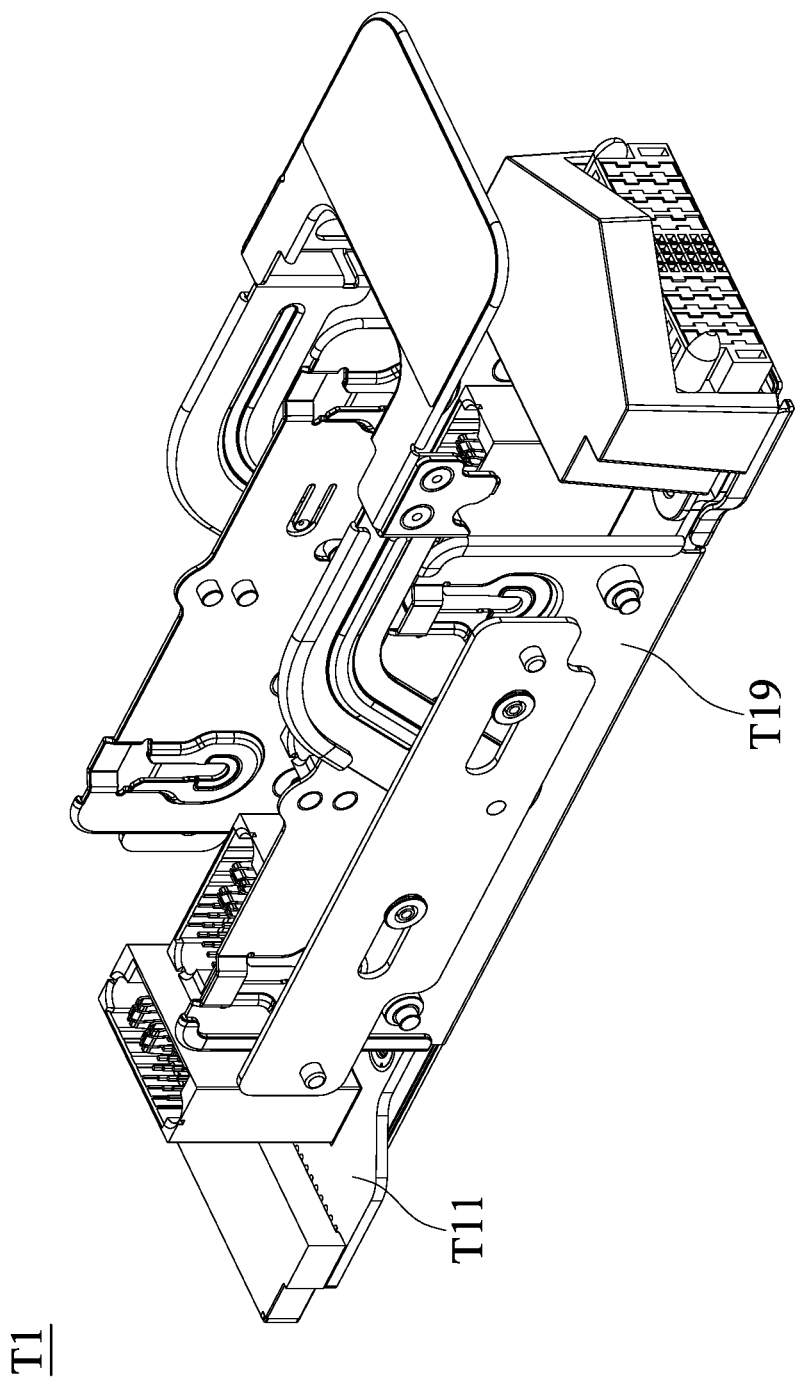
FIG. 8A shows a first power connection board module of an embodiment of the invention.

FIG. 8A shows a first power connection board module of an embodiment of the invention. With reference to FIGS. 7A, 7B and 8A, in one embodiment, the electronic device E further includes a first power connection board module T1. The first power connection board module T1 comprises a second tray structure T19 (similar to the tray structure mentioned above) and a first power connection board T11. The first power connection board T11 is disposed on the second tray structure T19. The second tray structure T19 is adapted to move the first power connection board T11 in the first direction Y to connect the first riser board 3 of the first riser board C1.

With reference to FIGS. 7A and 7B, in one embodiment, the first riser module C1 is located between the first power connection board module T1 and the hard-disk backplane module 40.

With reference to FIGS. 7A and 7B, in one embodiment, the electronic device E further comprises at least one first mainboard module M1 and a first power module P1. The first mainboard module M1 is adapted to slide in the first direction Y to connect the first riser board 3 of the first riser module C1. The first power module P1 is adapted to slide in the first direction Y to connect the first power connection board T11 of the first power connection board module T1. The first power connection board module T1 is located between the first power module P1 and the first riser module C1.

With reference to FIGS. 7A and 7B, in one embodiment, the electronic device E further comprises a second riser module C2 and at least one second mainboard module M2. The second riser module C2 comprises a second riser board C21. The second riser module C2 overlaps the first riser module C1. The second mainboard module M2 overlaps the first mainboard module M1. The second riser board C21 of the second riser module C2 is connected to the first riser board 3 of the first riser module C1 in a second direction Z. The second direction Z is perpendicular to the first direction Y. The second mainboard module M2 is adapted to side in the first direction Y to connect the second riser board C21.

Figure 8B:
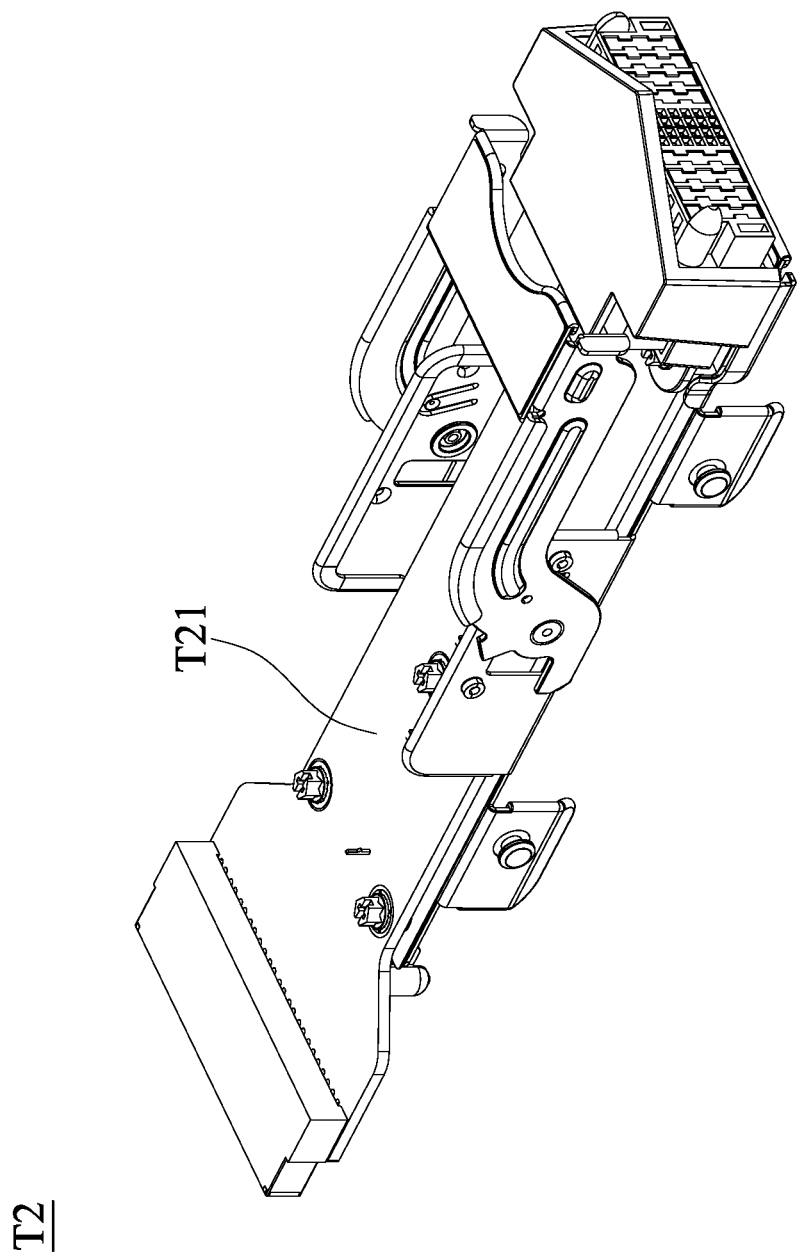
FIG. 8B shows a second power connection board module of the embodiment of the invention.
Figure 8C:
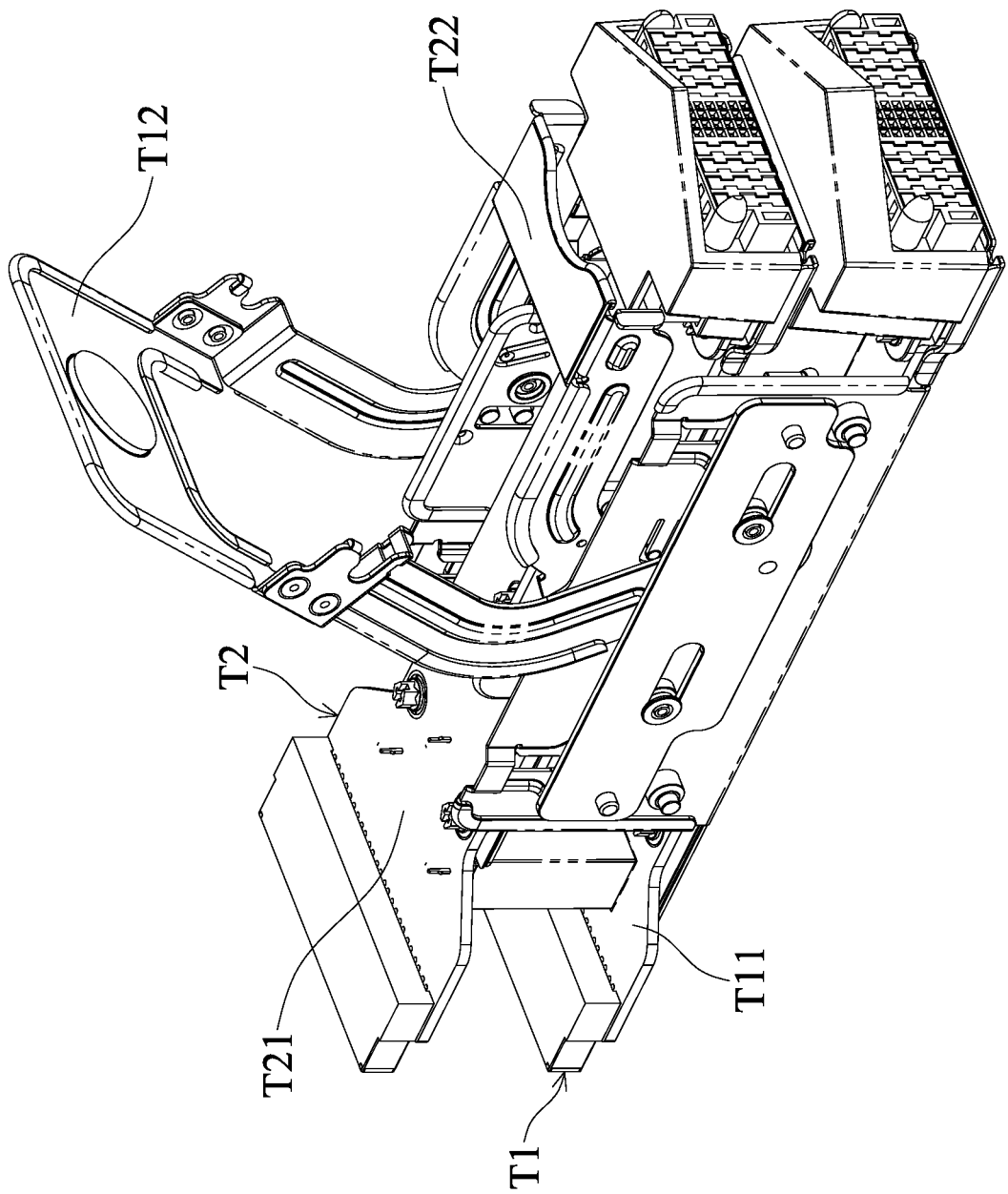
FIG. 8C shows the first power connection board module of the embodiment of the invention combined with the second power connection board module.

FIG. 8B shows a second power connection board module of the embodiment of the invention. FIG. 8C shows the first power connection board module of the embodiment of the invention combined with the second power connection board module. With reference to FIGS. 7A, 7B, 8B and 8C, in one embodiment, the electronic device E further comprises a second power connection board module T2 and a second power module P2. The second power connection board module T2 overlaps the first power connection board module T1. The second power module P2 overlaps the first power module P1. The second power connection board module T2 comprises a second power connection board T21. The second power connection board T21 is adapted to side in the first direction Y to connect the second riser board C21.

The second power module P2 is adapted to side in the first direction Y to connect the second power connection board T21 of the second power connection board module T2. Additionally, the second power connection board T21 of the second power connection board module T2 is connected to the first power connection board T11 of the first power connection board module T1 in the second direction Z.

With reference to FIGS. 7A and 7B, in one embodiment, the electronic device E further comprises a fan module F. The fan module F connects the first riser board 3 of the first riser module C1 in the second direction Z.

Figure 9A:
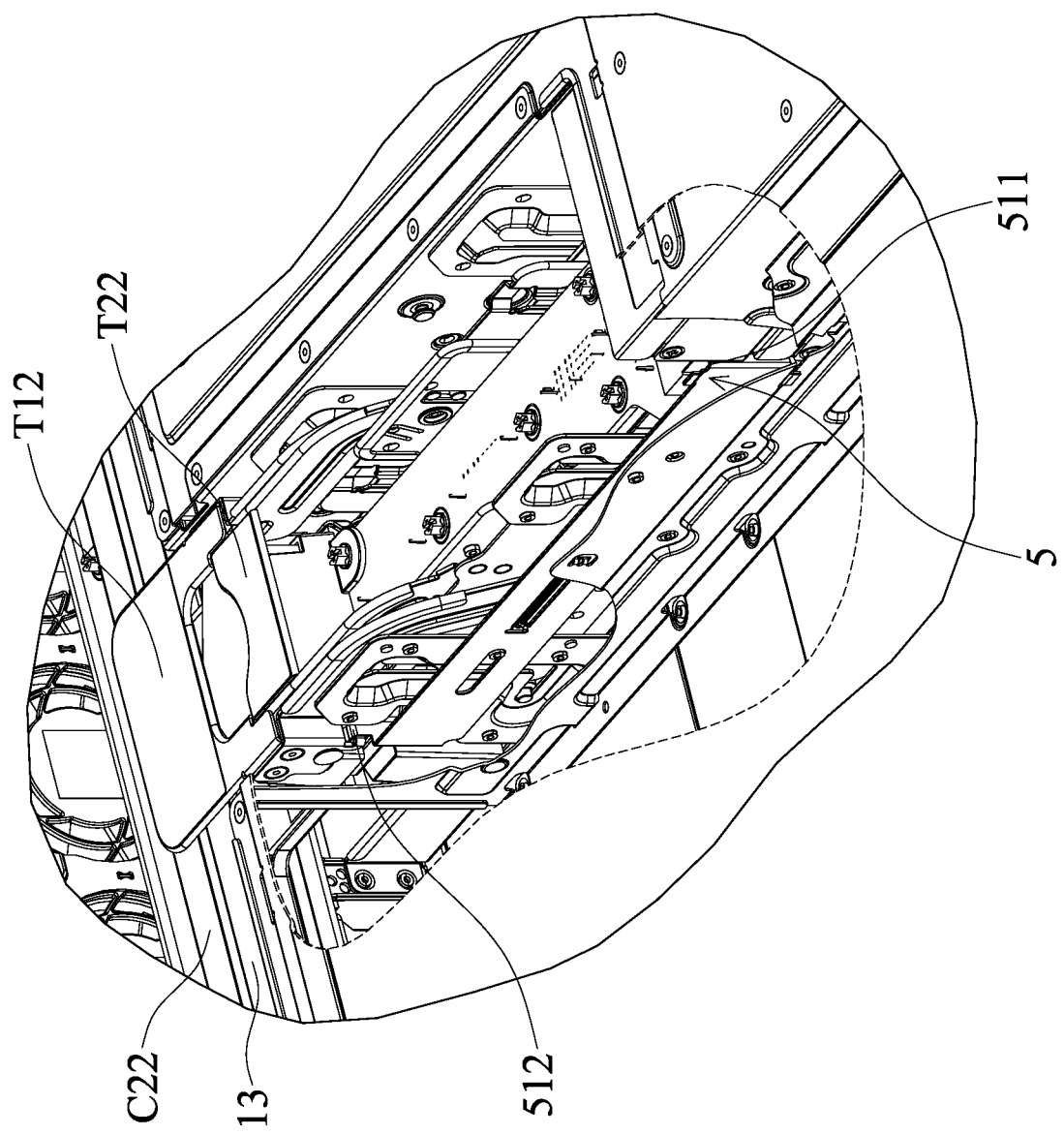
FIG. 9A shows a locking design of the embodiment of the invention.

FIG. 9A shows a locking design of the embodiment of the invention. With reference to FIGS. 8C and 9A, in one embodiment, the first riser module C1 comprises a first riser module grip 13. The second riser module C2 comprises a second riser module grip C22. The first power connection board module T1 comprises a first power connection board module grip T12. The second power connection board module T2 comprises a second power connection board module grip T22. The first power connection board module grip T12 is adapted to overlap at least portions of the first riser module grip 13 and the second riser module grip C22. The first power connection board module grip T12 is adapted to overlap at least a portion of the second power connection board module grip T22. In other words, before the first power connection board module grip T12 is lift up, the first riser module grip 13, the second riser module grip C22 and the second power connection board module grip T22 cannot be lifted.

Figure 9B:
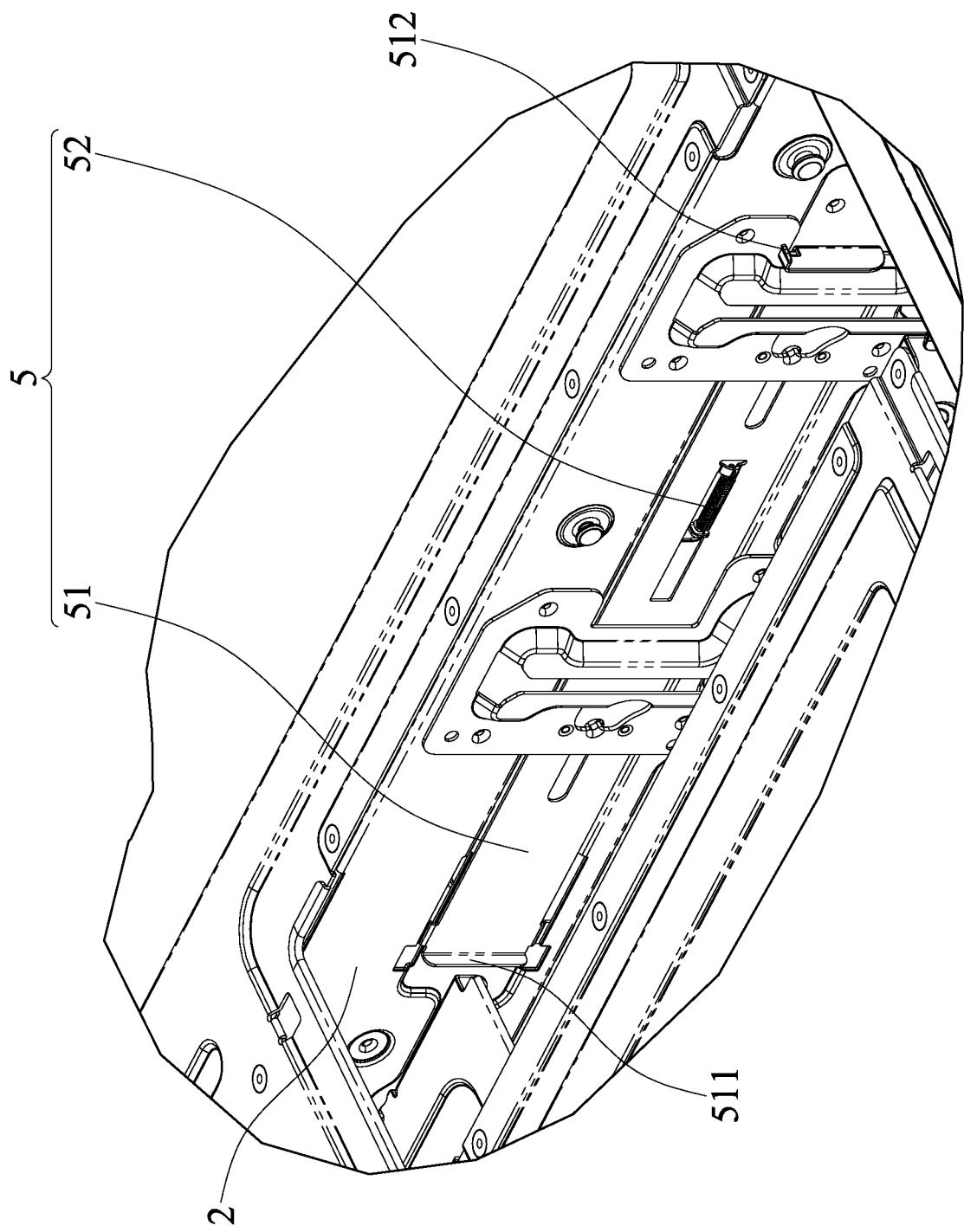
FIG. 9B shows a locking unit of the embodiment of the invention (the area IX of FIG. 7A)
Figure 9C:
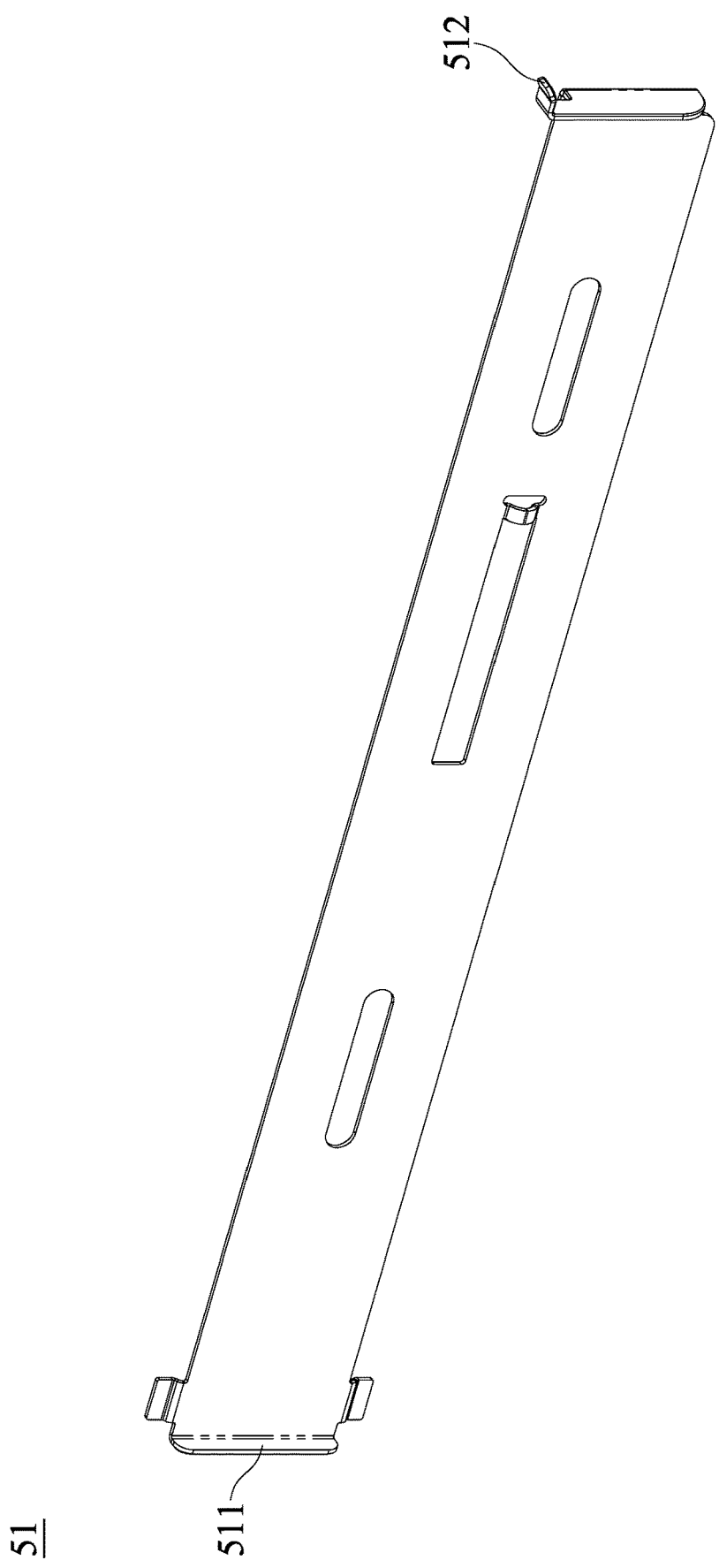
FIG. 9C shows a locking member of the embodiment of the invention.
Figure 9D:
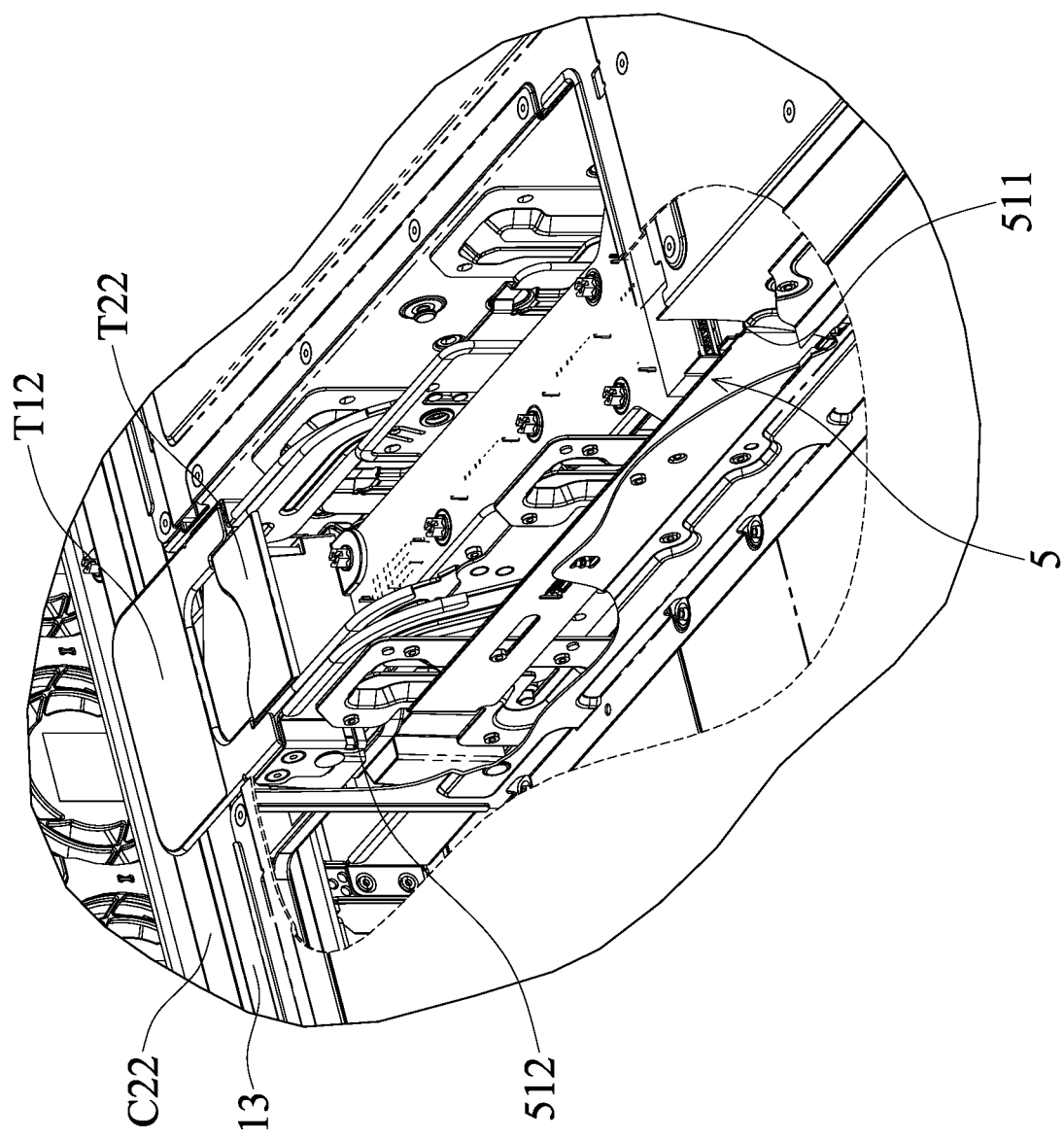
FIG. 9D shows the locking unit of the embodiment of the invention releasing the first power connection board module grip.

FIG. 9B shows a locking unit of the embodiment of the invention (the area IX of FIG. 7A). FIG. 9C shows a locking member of the embodiment of the invention. FIG. 9D shows the locking unit of the embodiment of the invention releasing the first power connection board module grip. With reference to FIGS. 9A, 9B, 9C and 9D, in one embodiment, the electronic device E includes a locking unit 5. The locking unit 5 comprises a locking member 51 and a spring 52. The spring 52 is connected to the locking member 51 and the housing 2. The locking member 51 includes a pushing portion 511 and a locking portion 512. When the first power module is connected to the first power connection board module, the first power module pushes the pushing portion 511 of the locking unit 5 in the first direction Y. Otherwise, when the second power module is connected to the second power connection board module, the second power module pushes the pushing portion 511 of the locking unit 5 in the first direction Y. Then, the locking portion 512 of the locking unit 5 locks the first power connection board module grip T12 of the first power connection board module T1. As mentioned above, as the locking member 51 locks the first power connection board module grip T12, the first power connection board module grip T12, the first riser module grip 13, the second riser module grip C22 and the second power connection board module grip T22 cannot be lifted. With reference to FIG. 9C, when the first power module is separated from the first power connection board module and the second power module is separated from the second power connection board module, the locking portion 512 of the locking unit 5 is separated from the first power connection board module grip T12 of the first power connection board module T1 to release the first power connection board module grip T12, and the first power connection board module grip T12 can be lift. In one embodiment, the locking member 51 is a sheet structure, which can be pushed by the first power module or the second power module to lock the first power connection board module grip T12.

Figure 10:
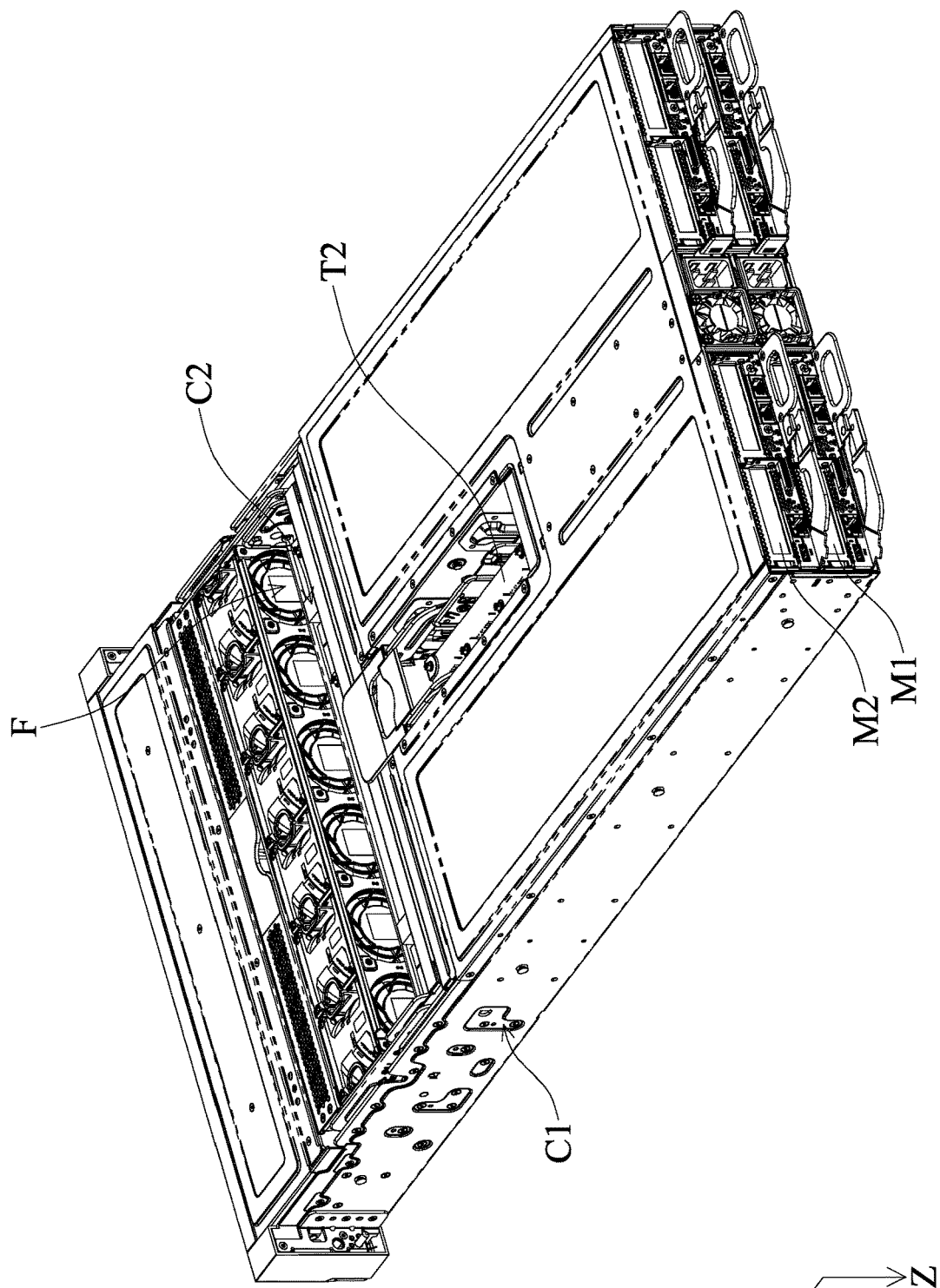
FIG. 10 is an assembled view of the electronic device of the embodiment of the invention.

FIG. 10 is an assembled view of the electronic device of the embodiment of the invention. With reference to FIG. 10, when the electronic device E is assembled, the second mainboard module M2 overlaps the first mainboard module M1, the second riser module C2 overlaps the first riser module C1, and the second power connection board module T2 overlaps the first power connection board module T1. In one embodiment, when the electronic device E is assembled, the hard-disks H are connected to the hard-disk backplane module 40. The hard-disks H supports hot swapping function. The second riser module C2 is connected to the first riser module C1 in the second direction Z. The fan module F is connected to the first riser module C1 in the second direction Z. The fan module F includes a plurality of fans. After the second riser module C2 is assembled to the first riser module C1, the first riser module C1 is assembled to the housing 2. Due to the first tray structure 1 of the first riser module C1, the first riser module C1 is connected to the hard-disk backplane module 40 in the first direction Y. The second power connection board module T2 is connected to the first power connection board module T1 in the second direction Z. After the second power connection board module T2 is connected to the first power connection board module T1, the first power connection board module T1 is assembled to the housing 2. Due to the second tray structure T19 of the first power connection board module T1, the first power connection board module T1 and the second power connection board module T2 are connected to the first riser module C1 and the second riser module C2 in the first direction Y simultaneously. In the meantime, the first riser module grip 13, the second riser module grip C22, the second power connection board module grip T22 and the first power connection board module grip T12 are overlapping to each other. In other words, the first power connection board module grip T12 overlaps and covers at least portions of the first riser module grip 13, the second riser module grip C22 and the second power connection board module grip T22. Next, the first power module P1 and the second power module P2 are connected to the first power connection board module T1 and the second power connection board module T2 in the first direction Y. The locking unit 5 then locks the first power connection board module grip T12 of the first power connection board module T1. Finally, the first mainboard module M1 and the second mainboard module M2 are connected to the first riser module C1 and the second riser module C2 in the first direction Y. In one embodiment, there are two first mainboard modules M1 and two second mainboard modules M2.

Utilizing the electronic device of the embodiment of the invention, the riser module, the hard-disk backplane module, the power connection board module and the mainboard module are plugged directly into each other. There is no need for conventional cables. The electronic device of the embodiment of the invention can be easily assembled and disassembled. The electronic device of the embodiment of the invention also provides improved reliability and heat dissipation.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A tray structure, adapted to be connected to a housing, comprising:
  a tray body, comprising a tray body post, wherein the tray body post is fixed to the tray body;
  a slider, comprising a slider post, wherein the slider post is fixed to the slider; and
  a grip, pivoting on the tray body and the slider, wherein when the grip is in a first grip orientation, the tray body post is in a first tray post position relative to the slider post, and when the grip is in a second grip orientation, the tray body post is in a second tray post position relative to the slider post,
  wherein the first tray post position differs from the second tray post position.

2. The tray structure as claimed in claim 1, wherein the housing comprises a housing groove, the housing groove comprises a first section and a second section, the first section is perpendicular to the second section, and when the grip is in the first grip orientation, the tray body post and the slider post are adapted to be inserted into the first section simultaneously, and when the grip is rotated from the first grip orientation to the second grip orientation, the tray body post is slid along the second section into the second tray post position.

3. The tray structure as claimed in claim 2, wherein the grip comprises a first pivot portion and a second pivot portion, the first pivot portion pivots on the slider, and the second pivot portion pivots on the tray body.

4. The tray structure as claimed in claim 3, wherein the grip comprises a holding section and a connection arm, the first pivot portion and the second pivot portion are disposed on the connection arm, the slider is sandwiched between the connection arm and the housing, and the connection arm is sandwiched between the slider and the tray body.

5. The tray structure as claimed in claim 4, wherein the connection arm comprises a first connection arm surface and a second connection arm surface, the first connection arm surface is opposite the second connection arm surface, the first pivot portion protrudes from the first connection arm surface, and the second pivot portion protrudes from the second connection arm surface.

6. The tray structure as claimed in claim 5, wherein the slider comprises a slider groove, the tray body comprises a tray body post, the tray body post is inserted into the slider groove and is adapted to slide along the slider groove, and an extending direction of the slider groove is parallel to an extending direction of the second section.

7. The tray structure as claimed in claim 6, wherein the tray body further comprises a tray body slot, the second pivot portion slides in the tray body slot, and an extending direction of the tray body slot is parallel to an extending direction of the first section.

8. An electronic device, comprising:
  a housing, comprising a housing groove, wherein the housing groove comprises a first section and a second section, and the first section is perpendicular to the second section; and
  a tray structure, comprising:
    a tray body, comprising a tray body post;

a slider, comprising a slider post; and
a grip, pivoting on the tray body and the slider, wherein when the grip is in the first grip orientation, the tray body post is in a first tray post position relative to the slider post, and when the grip is in the second grip orientation, the tray body post is in a second tray post position relative to the slider post,
wherein when the grip is in the first grip orientation, the tray body post and the slider post are adapted to be inserted into the first section simultaneously, and when the grip is rotated from the first grip orientation to the second grip orientation, the tray body post is slid along the second section into the second tray post position.

9. The electronic device as claimed in claim 8, further comprising a first riser board and a backplane, wherein the first riser board comprises at least one first riser board connection port, the backplane comprises at least one backplane connection port, the first riser board is disposed on the tray body, the backplane is disposed on the housing, and when the grip is rotated from the first grip orientation to the second grip orientation, the tray body is moved from a first tray position to a second tray position relative to the housing, and the first riser board connection port is connected to the backplane connection port.

10. The electronic device as claimed in claim 9, wherein the tray body comprises a tray body groove, the housing comprises a housing post, and when the tray body is moved from the first tray position to the second tray position relative to the housing, the housing post slides in the tray body groove.

11. The electronic device as claimed in claim 9, wherein the grip comprises a first pivot portion and a second pivot portion, the first pivot portion pivots on the slider, the second pivot portion pivots on the tray body, the grip comprises a holding section and a connection arm, the first pivot portion and the second pivot portion are disposed on the connection arm, the slider is sandwiched between the connection arm and the housing, and the connection arm is sandwiched between the slider and the tray body.

12. The electronic device as claimed in claim 11, wherein the connection arm comprises a first connection arm surface and a second connection arm surface, the first connection arm surface is opposite the second connection arm surface, the first pivot portion protrudes from the first connection arm surface, and the second pivot portion protrudes from the second connection arm surface.

13. The electronic device as claimed in claim 12, wherein the slider comprises a slider groove, the tray body comprises a tray body post, the tray body post is inserted into the slider groove and is adapted to slide along the slider groove, and an extending direction of the slider groove is parallel to an extending direction of the second section.

14. An electronic device, comprising:
a housing;
a first riser module, disposed in the housing, wherein the first riser module comprises a first tray structure and a first riser board, the first riser board is disposed on the first tray structure, and the first tray structure is adapted to move the first riser board in a first direction; and
a hard-disk backplane module, disposed in the housing, wherein the first tray structure is adapted to move the first riser board in the first direction to connect the hard-disk backplane module, wherein the hard-disk backplane module comprises a module circuit-board, and the module circuit-board is perpendicular to the first riser board; and
a plurality of hard-disks, connected to the hard-disk backplane module.

15. The electronic device as claimed in claim 14, further comprising a first power connection board module, wherein the first power connection board module comprises a second tray structure and a first power connection board, the first power connection board is disposed on the second tray structure, and the second tray structure is adapted to move the first power connection board in the first direction to connect the first riser board.

16. The electronic device as claimed in claim 15, wherein the first riser module is located between the first power connection board module and the hard-disk backplane module.

17. The electronic device as claimed in claim 16, further comprising at least one first mainboard module and a first power module, wherein the first mainboard module is adapted to slide in the first direction to connect the first riser board, the first power module is adapted to slide in the first direction to connect the first power connection board, and the first power connection board module is located between the first power module and the first riser module.

18. The electronic device as claimed in claim 17, further comprising a second riser module and at least one second mainboard module, wherein the second riser module comprises a second riser board, the second riser module overlaps the first riser module, the second mainboard module overlaps the first mainboard module, the second riser board is connected to the first riser board in a second direction, the second direction is perpendicular to the first direction, and the second mainboard module is adapted to side in the first direction to connect the second riser board.

19. The electronic device as claimed in claim 18, further comprising a second power connection board module and a second power module, wherein the second power connection board module overlaps the first power connection board module, the second power module overlaps the first power module, the second power connection board module comprises a second power connection board, the second power connection board is adapted to side in the first direction to connect the second riser board, and the second power module is adapted to side in the first direction to connect the second power connection board.

20. The electronic device as claimed in claim 19, further comprising a fan module, wherein the fan module connects the first riser board in the second direction.

21. The electronic device as claimed in claim 20, wherein the first riser module comprises a first riser module grip, the second riser module comprises a second riser module grip, the first power connection board module comprises a first power connection board module grip, the second power connection board module comprises a second power connection board module grip, the first power connection board module grip is adapted to overlap at least portions of the first riser module grip and the second riser module grip, and the first power connection board module grip is adapted to overlap at least a portion of the second power connection board module grip.

22. The electronic device as claimed in claim 21, further comprising a locking unit, wherein the locking unit comprises a locking member and a spring, the spring connects the locking member and the housing, the locking member comprises a pushing portion and a locking portion, when the power module is connected to the power connection board module, the power module pushes the pushing portion in the first direction, and the locking portion locks the first power connection board module grip.

\* \* \* \* \*